(12) United States Patent
Pirkle et al.

(10) Patent No.: US 8,008,183 B2
(45) Date of Patent: Aug. 30, 2011

(54) DUAL CAPILLARY IC WIREBONDING

(75) Inventors: Rex Warren Pirkle, Denison, TX (US); Sean Michael Malolepszy, Sherman, TX (US); David Joseph Bon, Gunter, TX (US)

(73) Assignee: Texas Instruments Incorporated, Dallas, TX (US)

( * ) Notice: Subject to any disclaimer, the term of this patent is extended or adjusted under 35 U.S.C. 154(b) by 685 days.

(21) Appl. No.: 11/867,228

(22) Filed: Oct. 4, 2007

(65) Prior Publication Data
US 2009/0091006 A1   Apr. 9, 2009

(51) Int. Cl.
*H01L 21/44* (2006.01)
*B23K 37/00* (2006.01)

(52) U.S. Cl. ........ 438/617; 228/4.5; 228/180.5; 228/904

(58) Field of Classification Search .................... None
See application file for complete search history.

(56) References Cited

U.S. PATENT DOCUMENTS

| | | | | |
|---|---|---|---|---|
| 3,641,660 A * | 2/1972 | Adams et al. | ............... | 228/180.5 |
| 3,780,926 A * | 12/1973 | Davis | ............... | 228/1.1 |
| 3,781,613 A * | 12/1973 | Robinson | ............... | 257/776 |
| 3,840,169 A * | 10/1974 | Steranko et al. | ............... | 228/4.1 |
| 4,142,288 A * | 3/1979 | Flammer et al. | ............... | 228/155 |
| 4,765,526 A * | 8/1988 | Sato | ............... | 228/4.5 |
| 4,860,433 A * | 8/1989 | Miura | ............... | 29/605 |
| 5,080,276 A | 1/1992 | Kashima et al. | | |
| 5,110,032 A * | 5/1992 | Akiyama et al. | ............... | 228/102 |
| 5,201,454 A * | 4/1993 | Alfaro et al. | ............... | 228/110.1 |
| 5,544,804 A * | 8/1996 | Test et al. | ............... | 228/180.5 |
| 5,839,640 A * | 11/1998 | Kinnaird | ............... | 228/4.5 |
| 5,904,288 A * | 5/1999 | Humphrey | ............... | 228/180.5 |
| 5,944,249 A * | 8/1999 | Macabitas et al. | ............... | 228/180.5 |
| 5,947,364 A * | 9/1999 | Tamura et al. | ............... | 228/1.1 |
| 5,979,743 A * | 11/1999 | Test | ............... | 228/180.5 |
| 6,112,973 A * | 9/2000 | Hortaleza et al. | ............... | 228/180.5 |
| 6,182,882 B1 * | 2/2001 | Hortaleza et al. | ............... | 228/4.5 |
| 6,322,659 B1 * | 11/2001 | Tekavec et al. | ............... | 156/312 |
| 6,564,115 B1 * | 5/2003 | Kinnaird | ............... | 700/121 |
| 6,749,100 B2 * | 6/2004 | Wong et al. | ............... | 228/4.5 |
| 7,320,423 B2 * | 1/2008 | Suresh et al. | ............... | 228/4.5 |
| 7,371,675 B2 * | 5/2008 | Kang et al. | ............... | 438/617 |
| 7,568,606 B2 * | 8/2009 | Wong et al. | ............... | 228/43 |
| 7,677,431 B2 * | 3/2010 | Wong et al. | ............... | 228/179.1 |
| 2003/0098333 A1 | 5/2003 | Nogawa | | |
| 2005/0051600 A1 * | 3/2005 | Howard et al. | ............... | 228/112.1 |
| 2007/0000878 A1 * | 1/2007 | Fujita et al. | ............... | 219/121.11 |
| 2007/0228110 A1 * | 10/2007 | Eldridge et al. | ............... | 228/180.5 |
| 2008/0035706 A1 * | 2/2008 | Tong et al. | ............... | 228/112.1 |

FOREIGN PATENT DOCUMENTS

GB        2177639 A  *  1/1987

(Continued)

OTHER PUBLICATIONS

Derwent English abstract and one clipped image from KrR724065 B1, Apr. 6, 2007, pgs.*

*Primary Examiner* — David E Graybill
(74) *Attorney, Agent, or Firm* — Yingsheng Tung; Wade J. Brady, III; Frederick J. Telecky, Jr.

(57) ABSTRACT

The invention discloses apparatus and methods for the formation of bond wires in integrated circuit assemblies by attaching two separate wires using a dual capillary bond head. The separate wires are preferably non-identical, for example, being of different gauges and/or material composition. According to a preferred embodiment of the invention, dual capillary bond head apparatus includes a rotatable ultrasonic horn with a pair of capillaries for selectably dispensing separate strands of bond wire and for forming bonds on bond targets. According to another aspect of the invention, a method is provided for dual capillary IC wirebonding including steps for using two dual capillary bond heads for contemporaneously attaching non-identical bond wires to selected bond targets on one or more IC package assemblies.

11 Claims, 8 Drawing Sheets

FOREIGN PATENT DOCUMENTS

| | | | | |
|---|---|---|---|---|
| JP | 61078133 | A | * | 4/1986 |
| JP | 62156828 | A | * | 7/1987 |
| JP | 62176138 | A | * | 8/1987 |
| JP | 63028043 | A | * | 2/1988 |
| JP | 02028339 | A | * | 1/1990 |
| JP | 04267353 | A | * | 9/1992 |
| JP | 05102223 | A | * | 4/1993 |
| JP | 05102232 | A | * | 4/1993 |
| JP | 06053268 | A | * | 2/1994 |
| JP | 09045717 | A | * | 2/1997 |
| KR | 2002057253 | A | * | 7/2002 |
| KR | 2006094438 | A | * | 8/2006 |

* cited by examiner

DUAL CAPILLARY IC WIREBONDING

TECHNICAL FIELD

The invention relates to microelectronic semiconductor chips, manufacturing equipment, and manufacturing processes. More particularly, the invention relates to wirebonding methods and apparatus for the manufacture of IC (integrated circuit) packages.

BACKGROUND OF THE INVENTION

Wirebonding is a widely used technique for electrically connecting contacts within a semiconductor package. Commonly, a precious metal wire, normally gold within the range of approximately 0.0010 and 0.0015 inches in diameter, has one end ball-bonded to a bond pad on an IC, and another end stitch (or wedge) bonded to a lead on a leadframe. In order to accomplish this, the wire is fed through a capillary associated with a moveable bond head. For a ball bond, a ball is formed on the exposed end of the wire using an electronic flame off (EFO) mechanism. The ball is pulled against the end of the capillary and is then pressed into position on a pre-heated bond pad where a combination of heat, pressure, and ultrasonic vibration is used to cause the ball to adhere to the surface of the bond pad. With the ball end of the wire secured to the bond pad, the gold wire is payed out through the capillary as the bond head moves into position at the appropriate lead. A stitch bond is formed on the lead, and a tail wire is payed out through the capillary, clamped, and severed. A new ball is then formed readying the wire end for the next ball bond, and the cycle is repeated.

Bond head machinery typically includes a fixed ultrasonic horn, which includes the capillary and is equipped for movement along the z-axis. Various peripheral mechanical and electronic systems support the implementation of the general wirebonding procedure described. Associated wire handling machinery typically includes a spool, tensioner, clamp, ball detector, and gas-powered venturi for feeding wire to the capillary. Movement in the x- and y-axes is implemented primarily by moving the bond head assembly in order to position the horn over the bond target.

In efforts to overcome various problems in the arts, dual bond head systems and techniques are sometimes used. In some applications, for example, two separate bond heads are oriented for making bonds perpendicular to one another. In such a dual bond head configuration, each bond head independently performs wirebonding with a capillary on a horn in a fixed orientation. Supposing, for instance, that a 20-pin IC required fourteen bonds oriented in one direction and six oriented in a direction perpendicular relative to the others. Using a dual head bonder known in the arts, each head may perform the first six of its bond wire installations simultaneously. One bond head would then be idled, while the other completed the remaining, in this case eight, bond wires. Such workload imbalances are relatively common among dual head bonding systems and methods using apparatus known in the arts. Thus, inefficiency is a problem with the dual bond head approach current in the art.

A significant portion of IC package manufacturing costs is due to the expense of precious metals, thus there are ongoing efforts to reduce the precious metal content of IC packages. Many IC package applications may be characterized as having at least two clearly separable groups of bond wires that, in theory, may employ significantly different wire gauges and still maintain reliable function. For example, a buffer function is readily separable into supply and output stages with high current demands, while input stages operate at current demands that are very small in comparison. Despite the opportunity for precious metal reduction by using smaller wire gauges on the input side, predominant applications commonly deploy the same wire size throughout an assembly, using the wire gauge demanded by the worst-case current path. Previous attempts to reduce gold content by use of dual head tandem arrangements have found little acceptance because such arrangements tend to reduce overall throughput due to the workload imbalance between the heads.

Due to these and other technological problems, improved apparatus and methods for wirebonding with more than one wire source would be useful and advantageous contributions to the art. The present invention is directed to overcoming, or at least reducing, problems present in the prior art, and also contributes one or more heretofore unforeseen advantages indicated herein.

SUMMARY OF THE INVENTION

In carrying out the principles of the present invention, in accordance with preferred embodiments thereof, the invention provides apparatus and methods useful for forming bond wires using two or more separate wires with a single bond head. The separate wires may be identical, or may differ in size and/or composition.

According to one aspect of the invention, a preferred method for wirebonding in an IC package includes steps for bringing a first capillary of a dual capillary bond head to bear on bond targets, dispensing a wire from the first capillary, and attaching bond wires to selected bond targets. In further steps, a second capillary of the dual capillary bond head is brought to bear on bond targets and a second wire is dispensed from the second capillary and is attached to selected bond targets to form bond wires.

According to another aspect of the invention, a method for IC wirebonding includes providing a bond head having two capillaries adapted for dispensing wire for bonding to bond targets on an IC assembly. Each of the capillaries is operable in a bonding mode and an idle mode. In further steps, one of the capillaries is operated in a bonding mode and the other capillary is contemporaneously maintained in an idle mode.

According to another aspect of the invention, in an example of a preferred embodiment, dual capillary bond head apparatus includes a horizontally moveable bond head assembly positioned on a bonding table. An ultrasonic horn extends over the bonding table with a pair of capillaries for selectably dispensing separate strands of wire and for forming bond wires on bond targets.

According to yet another aspect of the invention, a dual capillary bond head assembly in a preferred embodiment includes a horizontally moveable bond head assembly positioned on a bonding table with an ultrasonic horn extending over the bonding table as described above. A pair of capillaries offset at an acute angle to one another are provided on an ultrasonic horn adapted for rotating either of the capillaries into position for wirebonding on a bond target.

According to still another aspect of the invention, a method for dual capillary IC wirebonding includes steps for using two dual capillary bond heads for contemporaneously attaching bond wires to selected bond targets on one or more IC package assemblies.

According to another aspect of the invention, an IC assembly manufactured using apparatus and methods of the invention includes both insulated and un-insulated bond wires.

The invention has advantages including but not limited to one or more of the following: improved wirebonding methods and apparatus; improved wire deployment equipment and techniques, particularly in applications where it is desirable to use two or more wires having different characteristics; improved wirebonding process throughput; precious metal conservation; and decreased costs. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

The invention provides novel and useful methods and apparatus for IC wirebonding whereby two separate wires may be dispensed and installed using a single bond head. Alternative embodiments of the invention may be implemented, either using identical wires, or wires of various compositions. Methods and apparatus of the invention may also be combined in order to provide multiple bond head wirebonding with advantageous gains in productivity and cost savings.

Figure 1:
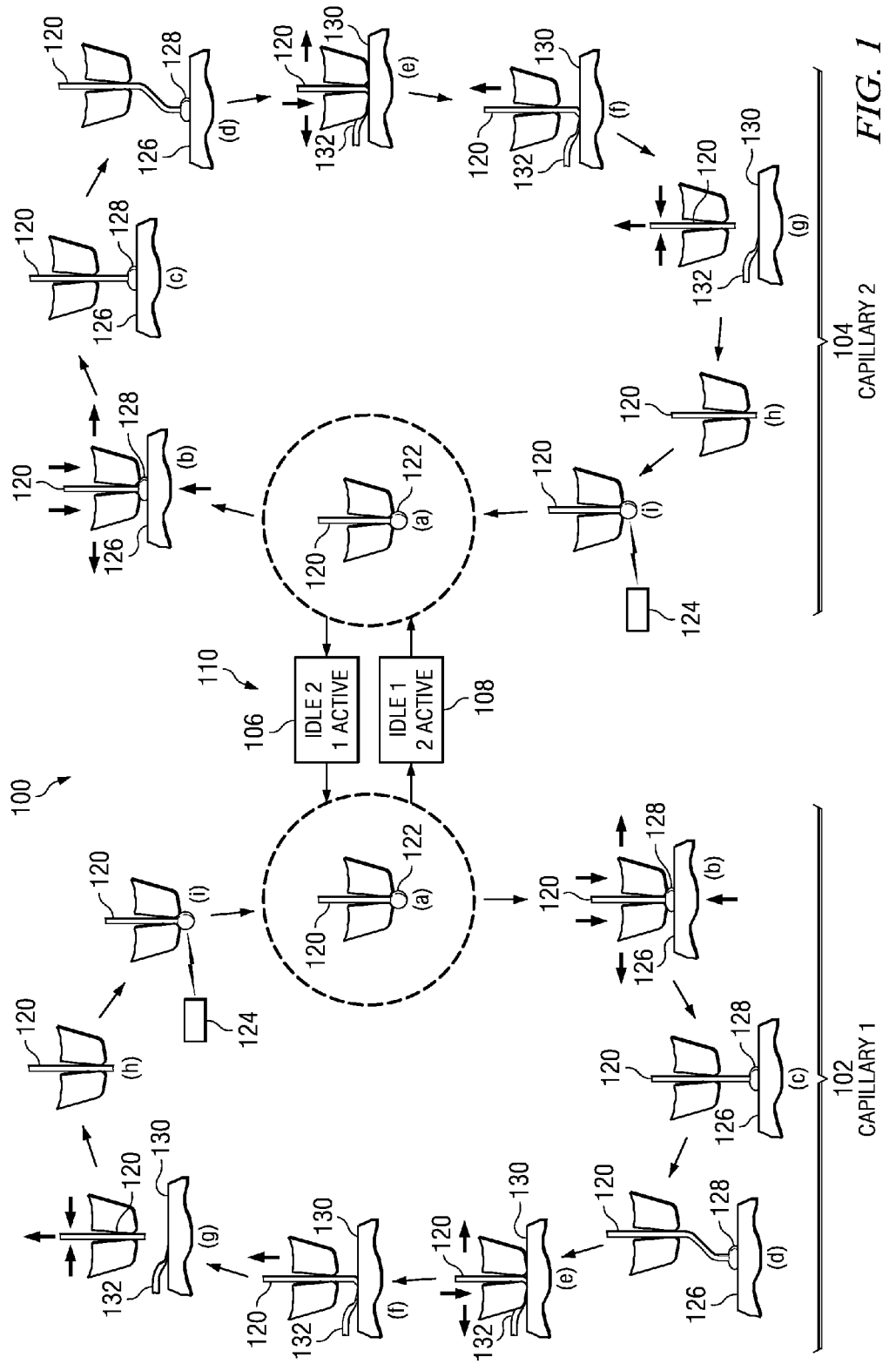
FIG. 1 is a schematic diagram illustrating examples of preferred embodiments of methods and apparatus implementing dual capillary wirebonding according to the invention.

First referring primarily to FIG. 1, an overview of an example of the operation of preferred embodiments of the invention is shown in a schematic diagram. The operation of the invention is shown with reference to a first capillary 102 and second capillary 104. As indicated in their two respective loops in FIG. 1, either of the first or second capillaries 102, 104, may be active while the other is idle, as indicated by the alternative states 106, 108, respectively, of the capillary selection loop 110. As shown in each of the active loops 102,104, of the diagram, a wire 120 is held in position (a) with a ball 122 formed at its end by exposure to a ball-forming mechanism, such as an electronic flame-off (EFO) electrode 124. The ball 122 is bonded (b) to a first bond target surface, e.g., a bond pad 126 on an IC. With the ball bond 128 secure, the capillary 102, 104 is moved (c) in order to form (d) a bond wire spanning between the ball bond 128 and a second bond target, e.g., a lead 130 on a package leadframe. A stitch bond 132 is formed (e) at the second bond target 130, the wire 120 is payed out (f) through the capillary, 102,104, clamped and pulled (g). The pulling (g) severs the wire 120 between the stitch bond 132 and the capillary 102, 104, and the tail of wire protruding (h) from the capillary 102, 104, is then presented to the EFO electrode 124 for the formation of a new ball 122 (i) at the end of the wire 120 so that the cycle 100 may be repeated. The individual steps, (a) through (i), may be generally familiar to those skilled in the arts, however, the details and advantages inherent in the capability of executing the steps using two capillaries performing in concert, as indicated by the two intersecting process loops 102, 104 joined by capillary selection loop 110, bears additional description and illustration.

Figure 2:
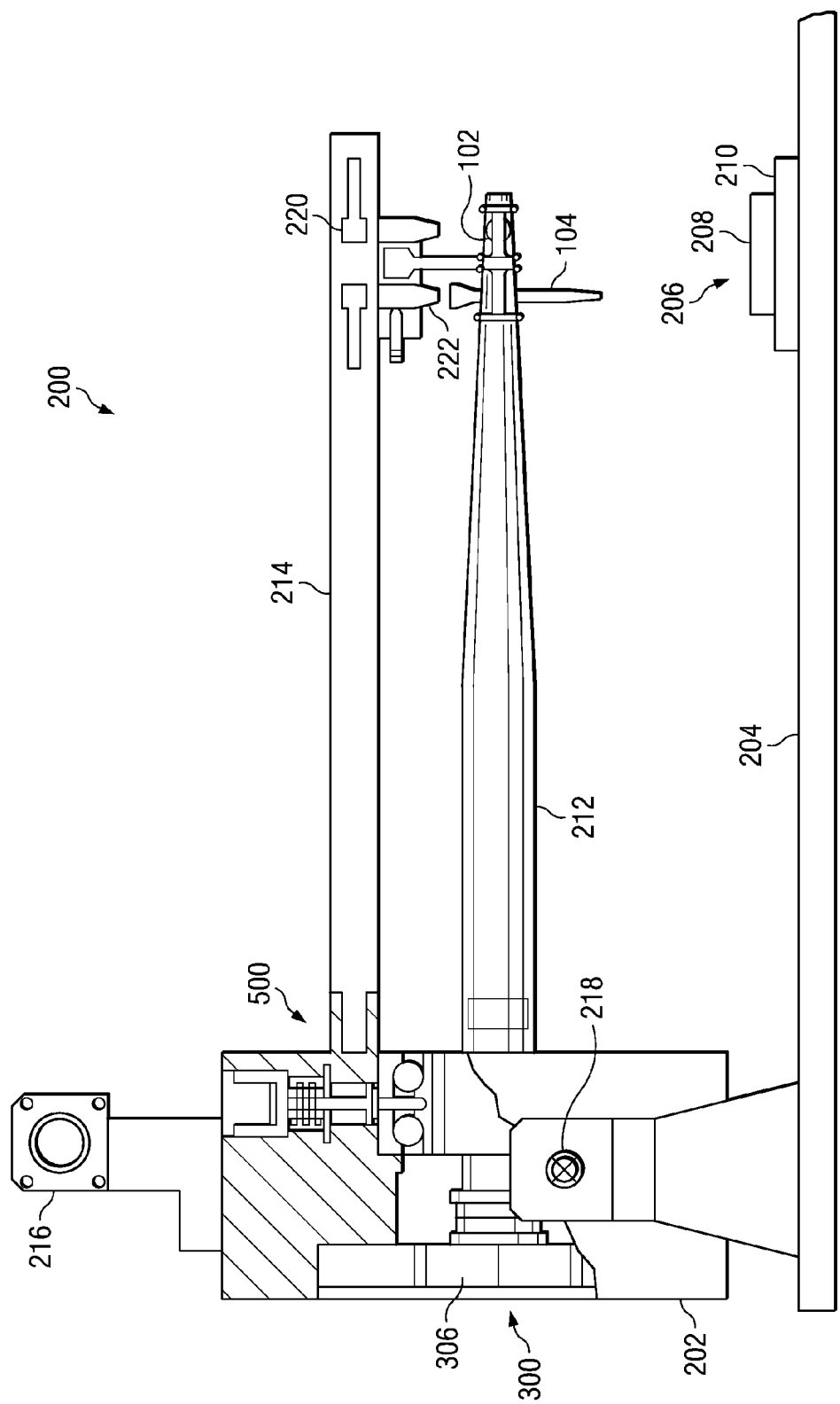
FIG. 2 is a partial cutaway side view of an example of apparatus in an implementation of a preferred embodiment of the invention.
Figure 3A:
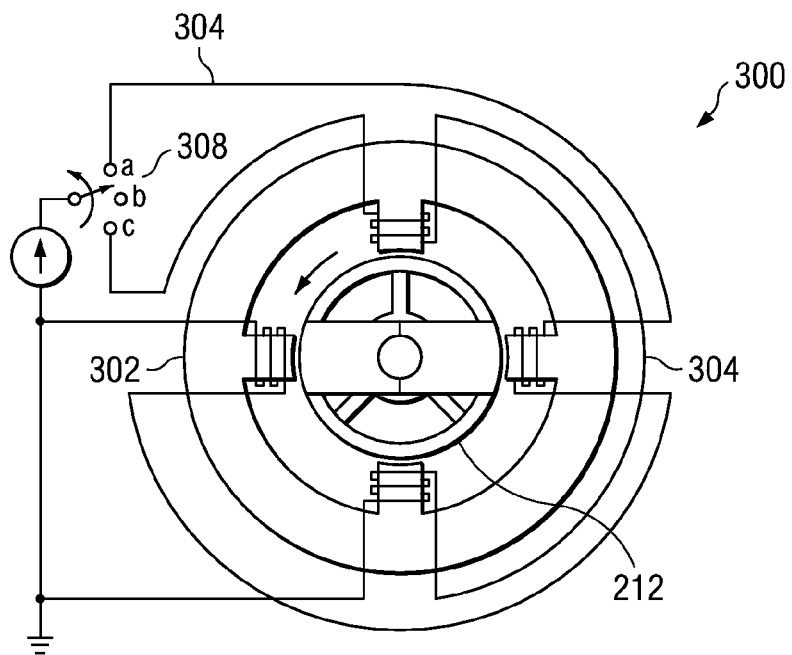
FIGS. 3A and 3B are cutaway side views of a portion of the apparatus shown in FIG. 2 in an example of a preferred embodiment of the invention.
Figure 3B:
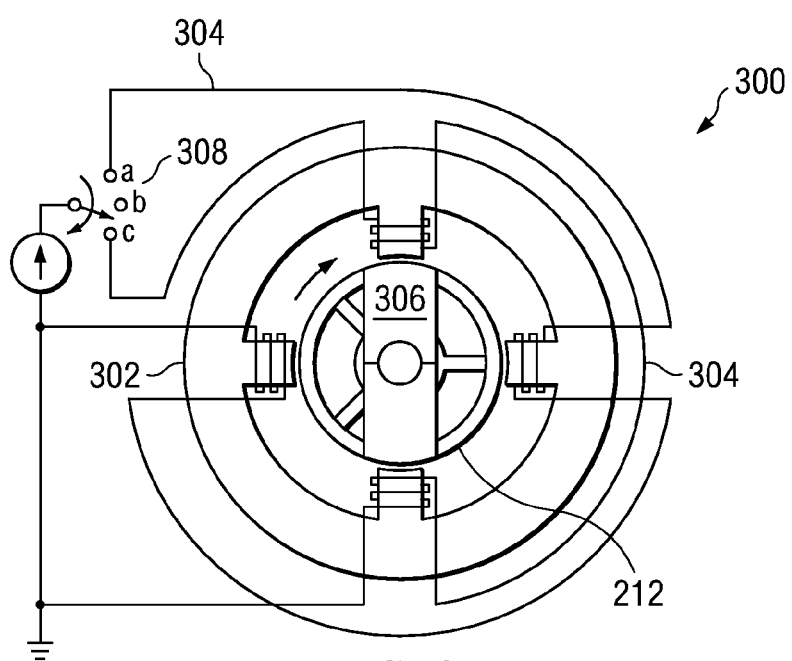

Now referring primarily to FIG. 2, a partial cutaway simplified side view of an example of a bond head assembly 200 according to the invention is shown. A bond head assembly housing 202, preferably moveable in the x-y axis, resides on a bonding table 204. The bonding table 204 also preferably supports a workpiece such as a partially assembled IC package 206 having an IC 208 affixed to a leadframe 210. The IC 208 and leadframe 210 each have bond targets, such as bond pads and leads. An ultrasonic horn 212 extends from the housing 202, accompanied by a boom 214. A mechanism is provided for raising and lowering the horn 212, preferably a galvo arm 216 and pivot 218, although suitable alternatives may also be used. The horn 212 has two capillaries 102, 104, for positioning above the bond targets of the workpiece 206. Suitable duplicate bond system components such as wire clamps 220, venturi 222, wire spools (not shown), and possibly other associated components are preferably provided in order to accommodate independent feed control of each of the wires (e.g., FIG. 1, 120). FIG. 2 depicts an example of the general placement of these peripheral components provided to support the operations of each of the independent capillaries 102, 104. It should be appreciated that capillaries of various materials, dimensions, and configurations may be used in various combinations depending upon the requirements of the application at hand. For example, in some instances it may be desirable to use identical capillaries, while in other instances it may be preferable to use a combination of standard, fine pitch, ultra-fine pitch, bottlenose, ceramic, ruby, and or alumina capillaries having different hole diameters, tip diameters, chamfer diameters, and so forth. Capillary selection may be made based on factors such as bond pad pitch, wire diameter, space available, and durability. The selectability of the capillaries during wirebonding operations, preferably by rotation of the ultrasonic horn as further described, provides advantages heretofore unavailable in the art.

FIGS. 3A-3B, and 4A-4B, show additional details of aspects of the horn 212 in this example of a preferred embodiment of the invention. A rotating mechanism 300 is provided for rotating the ultrasonic horn 212 in order to bring the capillaries 102, 104 into alignment with the workpiece 206 as desired. Rotating mechanisms such as stepper motors or other mechanical, electromechanical, pneumatic, or other means for rotating the horn 212 to align the capillaries 102, 104 may be used. In the example depicted in FIGS. 3A and 3B, horn 212 rotation is accomplished using a stator winding 302 with four poles 304 that may be used to apply torque to a permanent magnet 306, rotating the horn 212 into a desired position. The stator windings 304 and switch 308 arrangements are configured such that only one pair of opposing poles are energized at a time, and the active pair produces a north pole at one side and a south pole at the other. Such a configuration causes the permanent magnet 306 to align itself with the electromagnetic field, and so causes the horn 212 to rotate the capillaries into the desired positions. Positioning of the electromagnet poles 304 is such that each pair may rotate its respective capillary 102, 104 into a bonding position, preferably providing ultrasonic horn 212 rotation for two possible stationary alignments. The range of rotation is sufficient to position the capillaries 102, 104, to avoid interference with one another during bonding, while avoiding excessive rotation to prevent excessive wire deformation. The axes of the capillaries 102, 104 form an acute angle to one another, preferably about 45 degrees. In operation, rotation of the ultrasonic horn 212 serves to move one capillary into an active bonding position, e.g., FIG. 4A, 102, while the other 104 simultaneously rotates to an idle position. The rotation preferably is performed with the horn 212 in an 'up' state, lifted by suitable mechanisms.

Figure 4A:
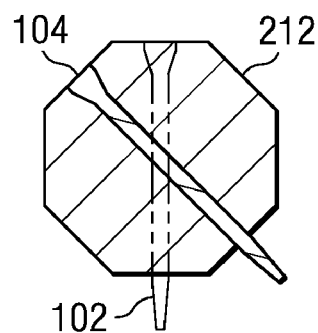
FIGS. 4A and 4B are cutaway side views of another portion of the apparatus shown in FIG. 2 in an example of a preferred embodiment of the invention.
Figure 4B:
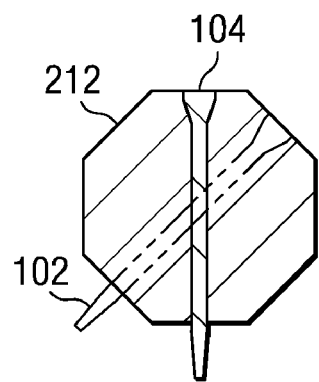
Figure 5:
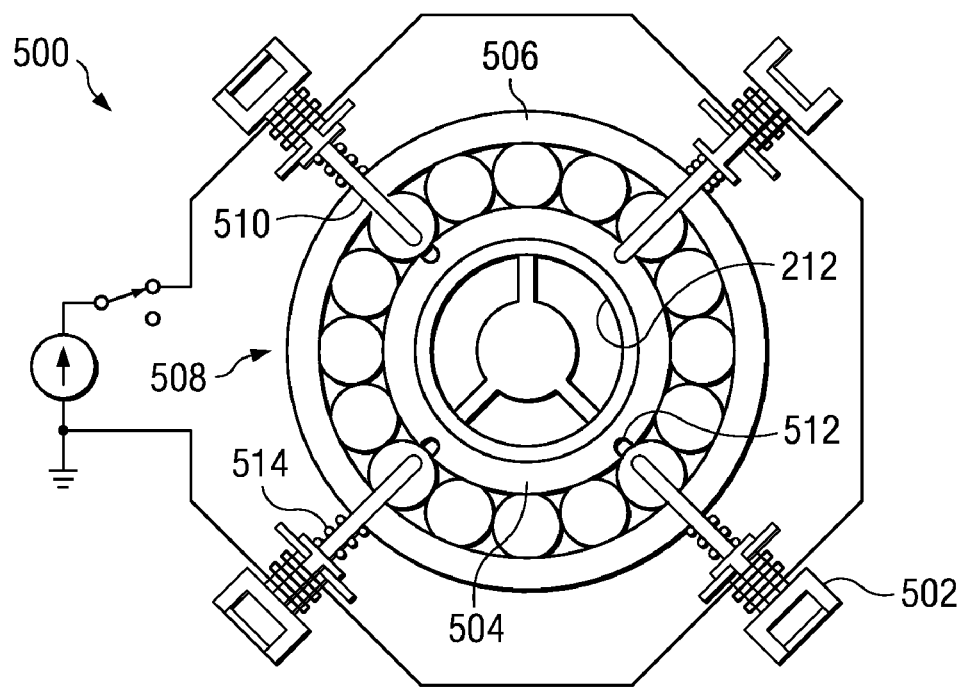
FIG. 5 is a cutaway side view of another portion of exemplary apparatus implementing the invention as shown in the embodiment of FIG. 2.

An example of a preferred capillary configuration is shown in FIGS. 4A and 4B. In this example, the first capillary 102 and second capillary 104 are oriented at an acute angle, preferably about 45 degrees apart from one another. Rotation of the ultrasonic horn 212 causes one or the other of the capillaries 102, 104 to align with a bond target. The rotatable ultrasonic horn 212 of the invention is also capable of being locked into position during use of either of the capillaries 102, 104 for bond formation. It should be recognized by those reasonably skilled in the arts that various rotating and locking mechanisms may be used within the scope of the invention. For example, as shown in the bearing lock mechanism 500 of FIG. 5, solenoids 502, or hydraulically-driven arrestor pins, or an electromagnet mechanism, may be used to firmly hold the horn 212 at a desired position during wirebonding. The ultrasonic horn 212 is preferably fitted into a dual-race 504, 506, bearing 508. This bearing 508 is fitted into the bond head assembly housing 202, so that the horn 212 is laterally fixed, but is free to rotate about its axis upon the inner race 504. The axes of the capillaries preferably form an acute angle to one another, as shown in FIGS. 4A and 4B. In operation, rotation of the ultrasonic horn 212 serves to move one capillary into an active bonding position, while moving the other capillary into an idle position. Once the active capillary is selected and the initial horn 212 alignment is made, the bearing lock mechanism 500 is preferably engaged in preparation for wirebonding. The bearing 508 preferably includes a symmetrical array of holes about the central circumference of both the inner and outer races 504, 506 in order to accept arrestor pins 510 for locking the inner and outer bearing races 504, 506 together, firmly immobilizing horn 212 rotation when engaged. As shown, each arrestor pin 510 is preferably an extended solenoid 502 plunger, with sufficient travel for full engagement of the inner race 504. At each pinning location, the arrestor pins 510 preferably pass through the bearing 508 into an inner race seat 512. Each solenoid plunger 510 is loaded against a light spring 514, so that in a deactivated state, each spring 514 decompresses and retracts the arrestor pins 510 fully from the inner race 504, allowing free horn 212 rotation. Preferably, each arrestor pin 510 is tapered so that constraints of initial horn 212 orientation are less critical, and upon activation of the rotation mechanism, e.g., FIGS. 3A-3B, 300, precise capillary alignment occurs. Once the solenoids 502 energize, overcoming the spring 514 force and engaging the arrestor pins 510, the current source to stator the windings 304 is deactivated, thus the stator 302 has no influence on ultrasonic horn 212 performance during wirebonding. The bearing lock horn 500 solenoids 502 remain activated throughout a bonding cycle, and ball-and-stitch operations then continue with the selected capillary in a manner similar to that used with conventional wire bond machinery.

It should be appreciated that the capability of switching capillaries during a wirebonding cycle can be used to provide notable advances in workload efficiency. The disclosed rotatable ultrasonic horn enables installation of dual capillaries oriented as desired in a single horn. Of course, the dual capillary arrangement of the invention has flexibility inherent in its design. It may be used for single-wire bonding, for example, as with a conventional bond head. In this mode of operation, the rotatable horn is locked in a single position and the second wire is held in an idle state. Considering that some wirebonding applications do not require the use of dual capillaries, this capability may be an important feature in some instances. Some noteworthy advantages in efficiency may nevertheless be achieved in such applications using the invention. For example, changing from one capillary to another provides a rapid means of replenishing the wire supply, or of changing wire sizes when switching production between packages requiring different gauge wires. Using the invention, throughput interruption occurs only during the selection of the active capillary, accompanied by a short x-y table move to align the bond target. Changing the active capillary requires only a 'z-up' operation, preferably accompanied by this sequence: unlock horn; rotate horn; lock horn; deactivate stator. In a single bond head operation, this selection cycle may occur twice as bonding progresses from one IC assembly to another, but in order to minimize interruption, one of the capillary changes may be made during the transport index cycle.

Figure 6A:
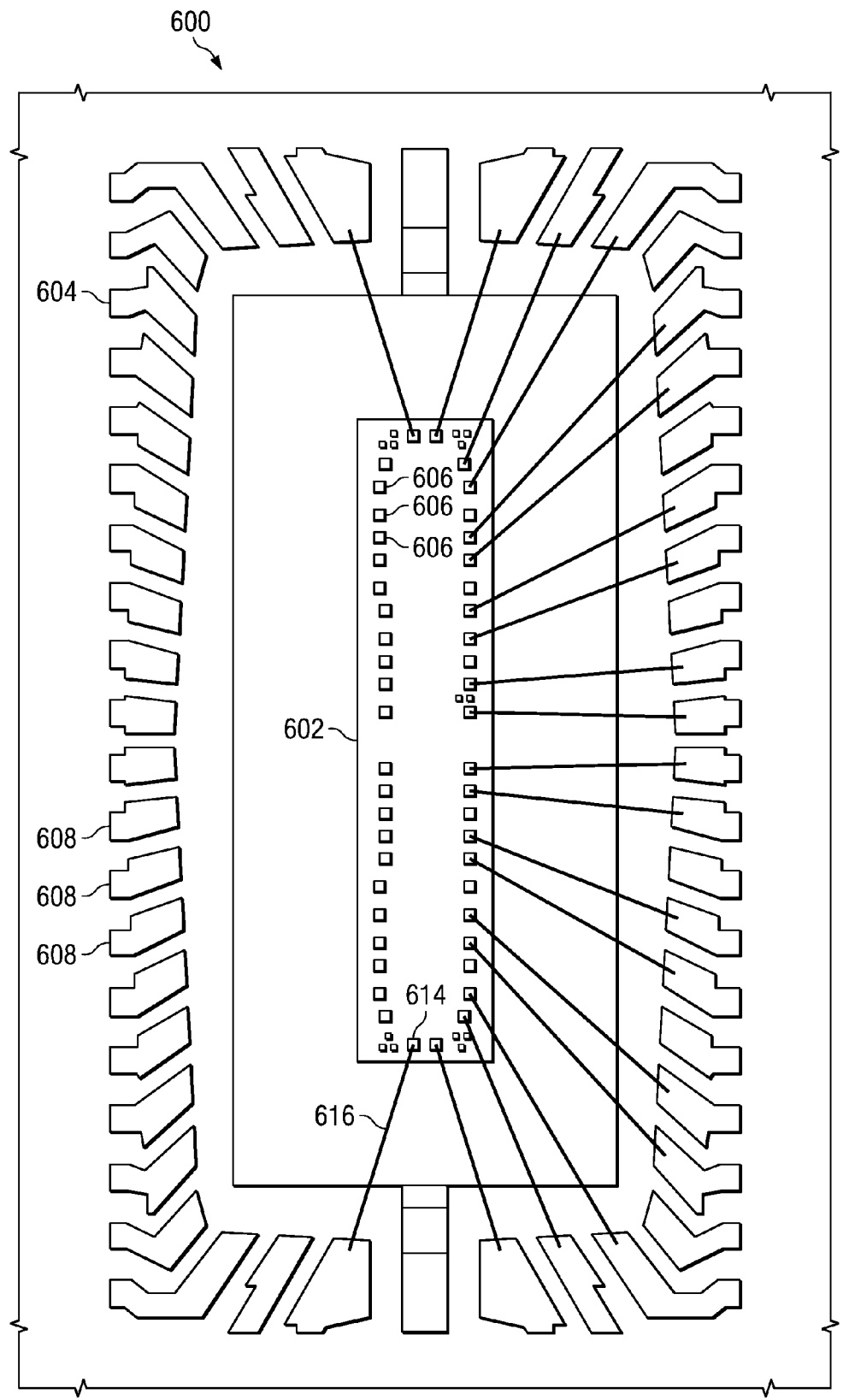
FIGS. 6A through 6C provide simplified top views depicting an example of the implementation of a preferred embodiment of the invention.
Figure 6B:
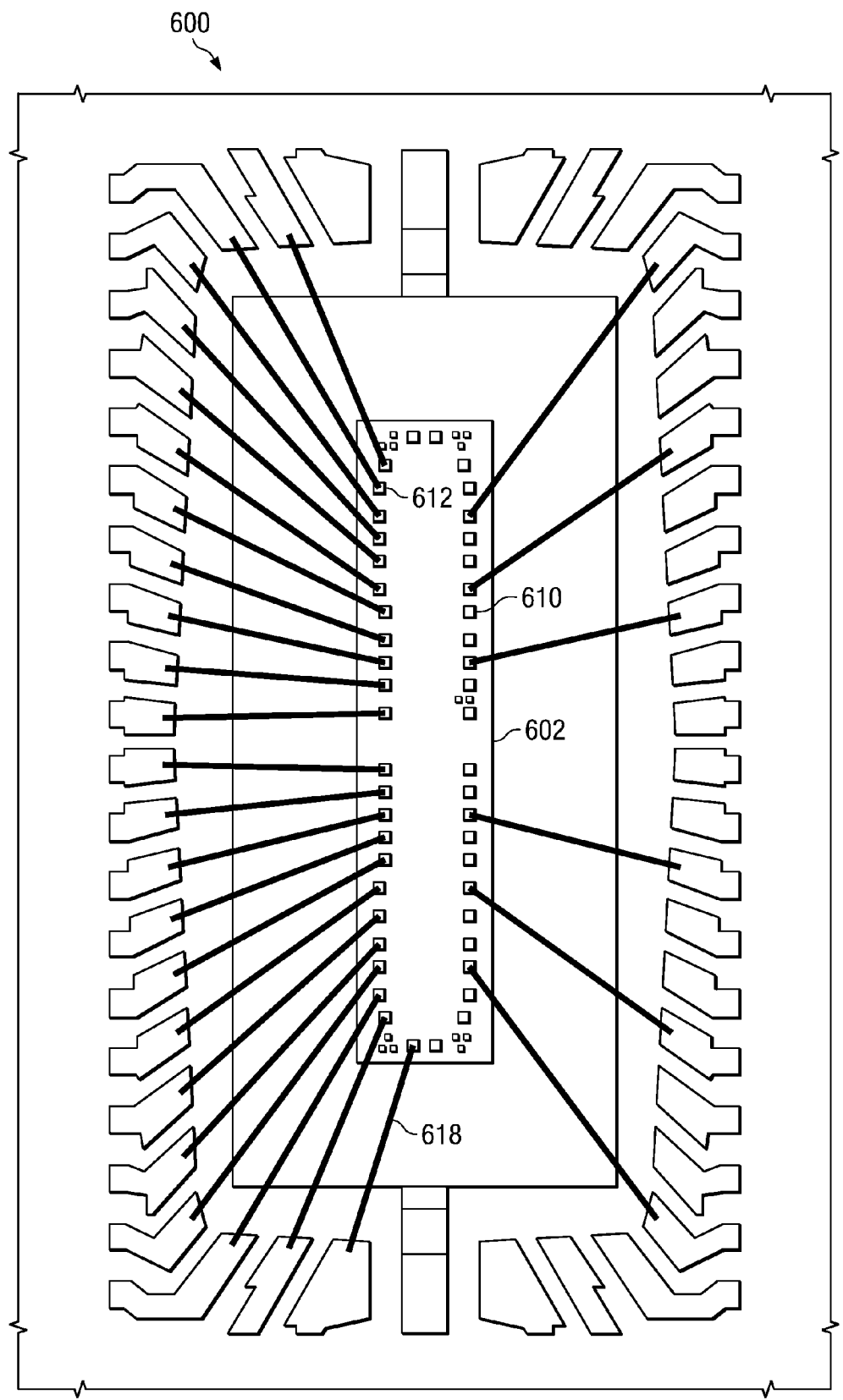

An aspect of the invention is the potential for conserving precious metals used in the wire bonds of an IC package. An example is shown in FIGS. 6A though 6C, in which an IC assembly 600 has a sixteen-bit driver IC 602 affixed to a leadframe 604, with forty eight pins 606 requiring wirebonding to the leads 608 of the leadframe 604. The IC 602 includes twelve supply pins 610, sixteen output pins 612, and twenty input pins 614. Using the invention, as shown in FIG. 6A, the twenty input pins 614 are preferably wirebonded using one capillary of a bond head, in this case using gold bond wire 616 of approximately 0.6 mils in diameter in order to provide the capability of carrying up to approximately 18 mA of current. As shown in FIG. 6B, the output 612 and supply pins 610, in this example requiring 180 mA capacity, are preferably wirebonded with 1.3 mil diameter gold bond wires 618 using the other capillary of the bond head. The resulting wirebonded IC assembly 620, shown in FIG. 6C prepared for encapsulation into an IC package, thus realizes a nearly one-third reduction in gold bond wire content compared to methods for using one wire gauge. This is but one example representative of the advantageous precious metal conservation aspect of the invention. Of course, many other examples abound, but cannot all be shown. The invention may be used with numerous types of IC assemblies with particular advantages in assemblies in which it is desirable to use wires of different sizes or composition. To cite a few more examples, the advantages of the invention may also be exploited further by using wires of different compositions according to application requirements, such as, gold and copper, or various alloys (e.g., different levels of gold purity), or combinations of insulated and un-insulated wires. It should be understood that according preferred embodiments of the invention, an IC package assembly may be partitioned into two bond wire groups, such as a small bond wire group and a large bond wire group, or one alloy group and another, or insulated and un-insulated bond wires. The different wirebonds may be made without significantly slowing throughput compared to common single bond head techniques, and significant advantages may be realized in terms of reducing precious metal content. Further advantages may be realized in packages for which the IC dimensions are influenced by the minimum bond pad size. In some cases, using the invention to reduce bond wire sizes for some of the bond pads may enable the use of smaller bond pads spaced more closely. As a result, smaller ICs and smaller packages may in turn be realized by implementing the invention.

Figure 6C:
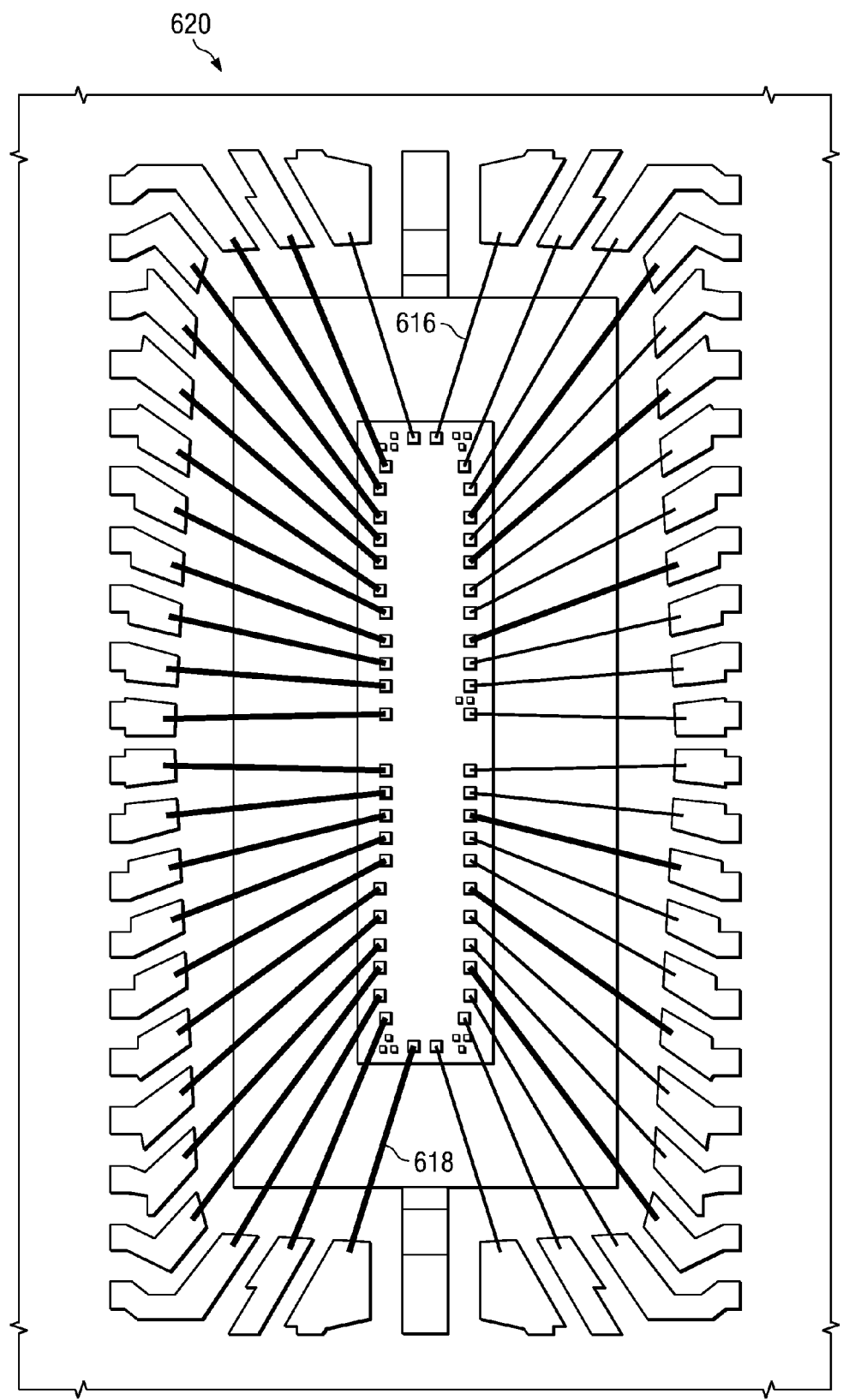

Revisiting the workload efficiency aspect of the invention, a conventional dual bond head approach for producing the IC assembly 620 of FIG. 6C would introduce a workload imbalance; the bond head installing the twenty smaller bond wires would run continuously while the bond head installing the larger bond wires would remain idle during the time that four of the small bond wires were being bonded. With the conventional approach, the greater the disparity in the number of each type of bond wire required, the greater the inefficiency. Using the invention as described in this single bond head example, regardless of the number of bond wires of each type, the nonproductive bond head time is limited to the minimal time required to rotate the horn in order to change the active capillary.

Figure 7:
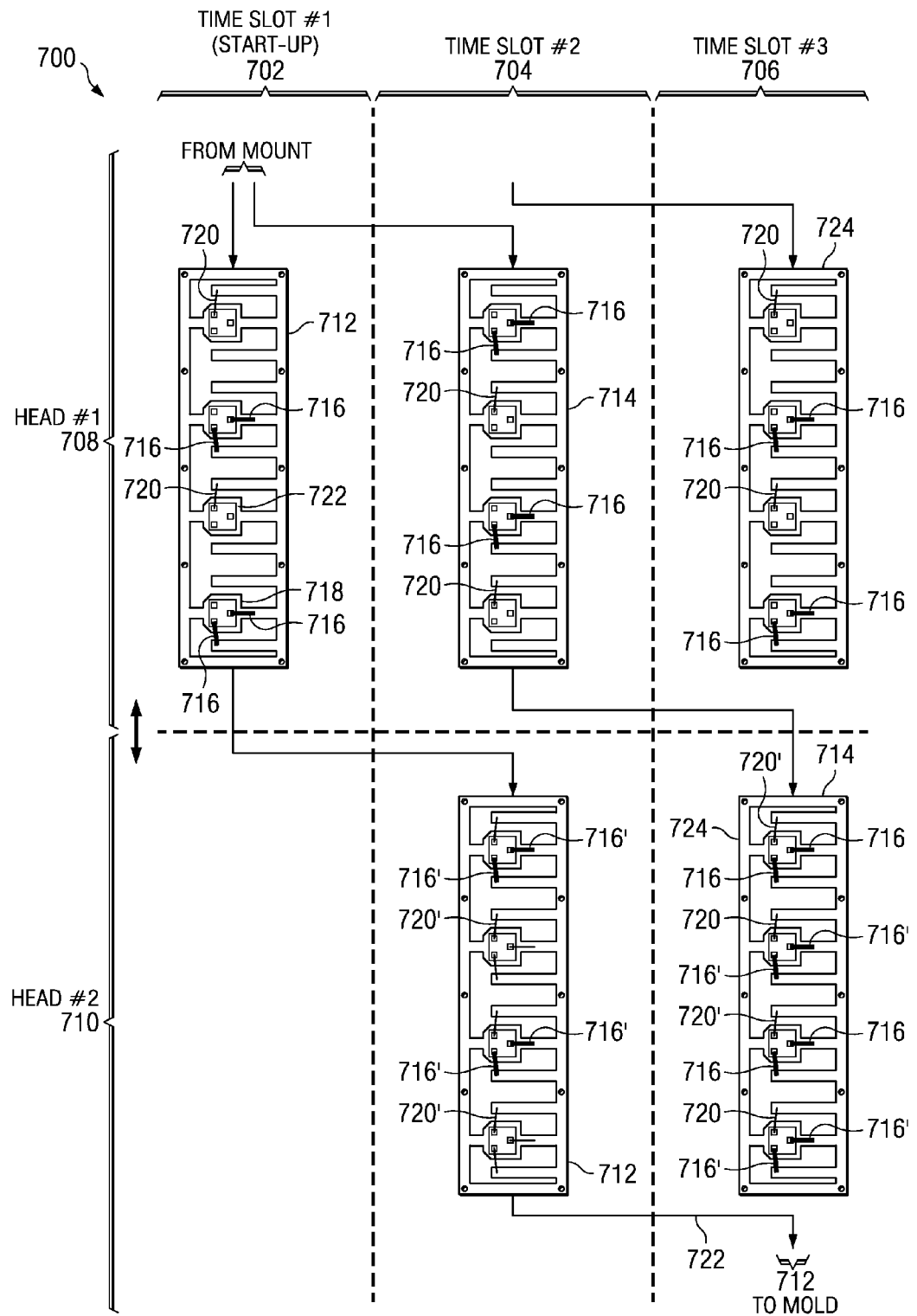
FIG. 7 is a combined simplified top view and process flow diagram depicting an example of the implementation of a preferred embodiment of the invention.

The invention provides further new and unique aspects of improved work flow in wirebonding processes, such as that denominated "interlaced" wirebonding herein. It has been determined during the course of developing the invention, that by using two rotatable ultrasonic horn bond head assemblies in a dual bond head configuration, additional advantages may be obtained. Now referring primarily to FIG. 7, an example of dual capillary, dual bond head, interlaced wirebonding according to the invention is shown. The workflow 700 in a preferred embodiment of an interlaced bonding method is shown in terms of three time slots 702, 704, 706 for showing the progression of the process. The activities of two dual capillary bond heads 708, 710 may be seen as follows. For the sake of this example, it is assumed that a particular type of IC-leadframe assembly is to be mass-produced using two different gauges of bond wire. Since each dual capillary bond head possesses the capability of installing both wire gauges, as further described herein, each dual capillary bond head is preferably used to perform alternating small wire and large wire bonds while indexing from one IC assembly to another, e.g., from IC assembly 712, to IC assembly 714. With the exception of initial start-up in the first time slot 702, when one bond head, e.g. 710 in this example, is idle, both bond heads, 708, 710, perform identical bonding operations at any given time. As shown, beginning with the first time slot 702, the first bond head 708 is brought to bear on the first IC assembly 712. The first bond head 708 initially installs bond wires of a first gauge 716, for example large output wires, on the first IC chip 718, then a bond wire of a second gauge 720, e.g., a reference pin bond with a single small wire, on the next IC 722, and alternately repeating this sequence thereafter. Initially, as shown in the first time slot 702, the second bond head 710 remains idle. In the second time slot 704, the first bond head 708 alternately installs bond wires of two gauges 716, 720 on a second IC assembly 714, but in this example, in reverse order compared to the sequence it used in the first time slot 702. Also during the second time slot 704, the second bond head 710 preferably performs identical operations on the first IC assembly 712, alternately bonding large wires 716' and small wires 720' at the bond targets bypassed by the first bond head 708 during the previous timeslot 702. As shown in the third time slot 706, the first IC assembly 712 has now been completed and may be ejected, as indicted by arrow 722, for further manufacturing processes such as encapsulation, and the second IC assembly 714 takes its position for further bonding by the second bond head 710. Meanwhile, a third IC assembly 724 is moved into a position accessible to the first bond head 708. The first bond head 708 completes large wire 716 and small wire 720 bonds on the third IC assembly 724. While the second bond head 710 completes the wire bonds 716', 720' on the second IC assembly 714, but in an order opposite to the previous, i.e., second, time slot 704 sequence. It may be seen that the operations occurring in the second and third time slots 702, 704 may be repeated cyclically numerous times until a desired number of IC assemblies are wirebonded. Thus, the interlaced wirebonding methods of the invention provide a remarkable and novel process flow with a workload very nearly evenly distributed between dual bond heads. It has been found that using adaptations of the disclosed apparatus and methods within the scope of the invention, interlaced wirebonding may be used to provide balanced throughput wirebonding workloads with any combination of differing wire sizes, wire compositions, and pin counts. It should be noted that the changes between capillaries of the dual capillary bond heads are preferably performed during the transport index, or x-y table move to an adjacent IC, making such changes transparent to throughput.

The methods and systems of the invention provide one or more advantages including but not limited to improved workload efficiency and precious metal conservation. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A method for IC wirebonding comprising the steps of:
bringing a first capillary of a dual capillary bond head to bear on a plurality of bond targets on an IC package assembly, the first capillary affixed to an ultrasonic horn;
dispensing a first wire from the first capillary and attaching one or more first bond wires to selected bond targets; and then
rotating the ultrasonic horn thereby displacing the first capillary and bringing a second capillary affixed to the ultrasonic horn and at a fixed acute angle with respect to the first capillary to bear on a plurality of bond targets on the IC package assembly; and
dispensing a second wire from the second capillary and attaching one or more second bond wires to selected bond targets.

2. The method according to claim 1 wherein the first and second wires are nonidentical.

3. The method according to claim 1 wherein the first and second wires comprise various materials.

4. The method according to claim 1 wherein the first and second wires are of various diameters.

5. The method according to claim 1 wherein one or more of the wires comprises an insulated wire.

6. The method according to claim 1 further comprising steps of using a second dual capillary bond head assembly for dispensing a third wire from a third capillary and for attaching one or more third bond wires to selected bond targets on the IC package assembly; and dispensing a fourth wire from a fourth capillary of the second dual capillary bond head assembly and attaching one or more fourth bond wires to selected bond targets on the IC package assembly.

7. The method according to claim 6 further comprising using the first and second dual capillary bond head assemblies for wirebonding integrated circuits on two leadframe strips.

8. A method for IC wirebonding comprising the steps of:
providing a bond head having two capillaries at a fixed acute angle with respect to each other adapted for dispensing wire for bonding to bond targets on an IC assembly wherein each of the capillaries is operable in a bonding mode and an idle mode;
selectively operating one of the capillaries in a bonding mode, further comprising steps for;
holding a ball formed at the end of the wire against the capillary;
then bonding the ball to a bond target on the IC assembly;
moving the capillary to form a bond wire span;
bonding the wire to another bond target;
moving the capillary and severing the wire, thereby forming a completed bond wire; and
forming a ball at the end of the remaining wire in the capillary; and, contemporaneously maintaining the other capillary in an idle mode.

9. The method according to claim 8 further comprising the steps of;
subsequently selecting the idle mode for the bonding capillary; and
contemporaneously, selecting the bonding mode for the idle capillary, aligning it with a target surface, and performing the bonding mode steps.

10. The method according to claim 8 wherein the two capillaries are used to form non-identical bond wires.

11. The method according to claim 8 further comprising steps for contemporaneously duplicating the operation of the dual capillary bond head using a second dual capillary bond head for wirebonding on a second IC assembly.

* * * * *